United States Patent
Ryu et al.

(10) Patent No.: US 8,526,262 B2
(45) Date of Patent: Sep. 3, 2013

(54) MULTI-CHANNEL SEMICONDUCTOR INTEGRATED CIRCUIT DEVICES FOR CONTROLLING DIRECT CURRENT GENERATORS AND MEMORY SYSTEMS INCLUDING THE SAME

(75) Inventors: Jang-Woo Ryu, Seoul (KR); Jung Sik Kim, Seoul (KR); So-Young Kim, Cheongju-si (KR)

(73) Assignee: Samsung Electronics Co., Ltd. (KR)

( * ) Notice: Subject to any disclaimer, the term of this patent is extended or adjusted under 35 U.S.C. 154(b) by 362 days.

(21) Appl. No.: 12/878,431

(22) Filed: Sep. 9, 2010

(65) Prior Publication Data
US 2011/0075501 A1    Mar. 31, 2011

(30) Foreign Application Priority Data
Sep. 25, 2009    (KR) .................. 10-2009-0091170

(51) Int. Cl.
*G11C 5/14* (2006.01)
(52) U.S. Cl.
USPC ...... 365/226; 365/227; 365/229; 365/185.11; 365/230.03; 365/241
(58) Field of Classification Search
USPC .............. 365/226, 227, 229, 185.11, 230.03, 365/241
See application file for complete search history.

(56) References Cited

U.S. PATENT DOCUMENTS

| | | | |
|---|---|---|---|
| 6,079,023 A | 6/2000 | Yoon et al. | |
| 6,195,306 B1 | 2/2001 | Horiguchi et al. | |
| 6,229,753 B1 * | 5/2001 | Kono et al. | ............. 365/230.03 |
| 2007/0216467 A1 | 9/2007 | Akiyama et al. | |

FOREIGN PATENT DOCUMENTS

| | | |
|---|---|---|
| JP | 11-203876 | 7/1999 |
| JP | 11-297071 | 10/1999 |
| JP | 2007-251351 | 9/2007 |
| KR | 100272163 B1 | 8/2000 |
| KR | 1020040044421 A | 5/2004 |
| KR | 1020070093862 A | 9/2007 |

* cited by examiner

*Primary Examiner* — Toan Le
(74) *Attorney, Agent, or Firm* — Myers Bigel Sibley & Sajovec

(57) ABSTRACT

Multi-channel semiconductor integrated circuit devices are provided including a plurality of memory devices that are independently accessible, each of the plurality of memory devices including at least one power generation unit and a control unit for controlling an operation of the at least one power generation unit, a detection unit for detecting an operation state of the plurality of memory devices, and a common control unit for commonly controlling an operation of the at least one power generation unit of the plurality of memory devices, according to the operation state of the plurality of memory devices detected by the detection unit. The control unit of each of the plurality of memory devices controls the operation of the at least one power generation unit of a corresponding one of the plurality of memory devices.

16 Claims, 17 Drawing Sheets

MULTI-CHANNEL SEMICONDUCTOR INTEGRATED CIRCUIT DEVICES FOR CONTROLLING DIRECT CURRENT GENERATORS AND MEMORY SYSTEMS INCLUDING THE SAME

CLAIM OF PRIORITY

This application claims priority to Korean Patent Application No. 10-2009-0091170, filed Sep. 25, 2009, the disclosure of which is hereby incorporated herein by reference as if set forth in its entirety.

FIELD

The present inventive concept is directed to semiconductor integrated circuit devices, and more particularly, to multi-channel semiconductor integrated circuit devices including a plurality of memory devices that are independently accessible and related memory systems.

BACKGROUND

A multi-channel semiconductor integrated circuit device including at least one memory device may be independently operated for each memory device. In other words, for each channel, direct current consumption is relatively large, compared to that of a semiconductor integrated circuit device having the same density. Thus, a direct current power generator and a node are shared in order to reduce the direct current consumption.

However, in the multi-channel semiconductor integrated circuit device independently operating for each channel, active (ACT) timing may be irregular in each channel and the deviation in the amount of consumption of charge is relatively large. Accordingly, it is difficult to anticipate a direct current voltage level to be generated. Furthermore, in the multi-channel semiconductor integrated circuit device independently operating for each channel, during standby (STBY) operation, standby voltages ripple and standby currents increase, compared to the semiconductor integrated circuit device having the same density.

SUMMARY

Some embodiments of the inventive concept provide a multi-channel semiconductor integrated circuit (IC) device independently operating for each channel which may integrally and efficiently control generation of power, and a memory system including the multi-channel semiconductor integrated circuit device.

According to further embodiments of the inventive concept, there is provided a multi-channel semiconductor integrated circuit device including a plurality of memory devices, a detection unit, and a common control unit. The plurality of memory devices are independently accessible and each of the plurality of memory devices includes at least one power generation unit and a control unit for controlling an operation of the at least one power generation unit. The detection unit detects an operation state of the plurality of memory devices. The common control unit commonly controls an operation of the at least one power generation unit of the plurality of memory devices, according to the operation state of the plurality of memory devices detected by the detection unit.

In the multi-channel semiconductor integrated circuit device, the control unit of each of the plurality of memory devices controls the operation of the at least one power generation unit of a corresponding one of the plurality of memory devices.

According to still further aspects of the inventive concept, there is provided a multi-channel semiconductor integrated circuit device including a plurality of memory devices and a detection unit.

The plurality of memory devices is independently accessible and each of the plurality of memory devices includes at least one power generation unit. The detection unit detects an operation state of the plurality of memory devices. In the multi-channel semiconductor integrated circuit device, the at least one power generation unit of the plurality of memory devices is independently controlled for each of the plurality of memory devices or commonly controlled for the plurality of memory devices, according to a control mode determined by the operation state of the plurality of memory devices detected by the detection unit.

According to some embodiments of the inventive concept, there is provided a memory system including the multi-channel semiconductor integrated circuit device, a controller for controlling the multi-channel semiconductor integrated circuit device, and a plurality of channels, each independently interfacing a corresponding one of the plurality of memory devices and the controller.

DETAILED DESCRIPTION OF EMBODIMENTS

Figure 1:
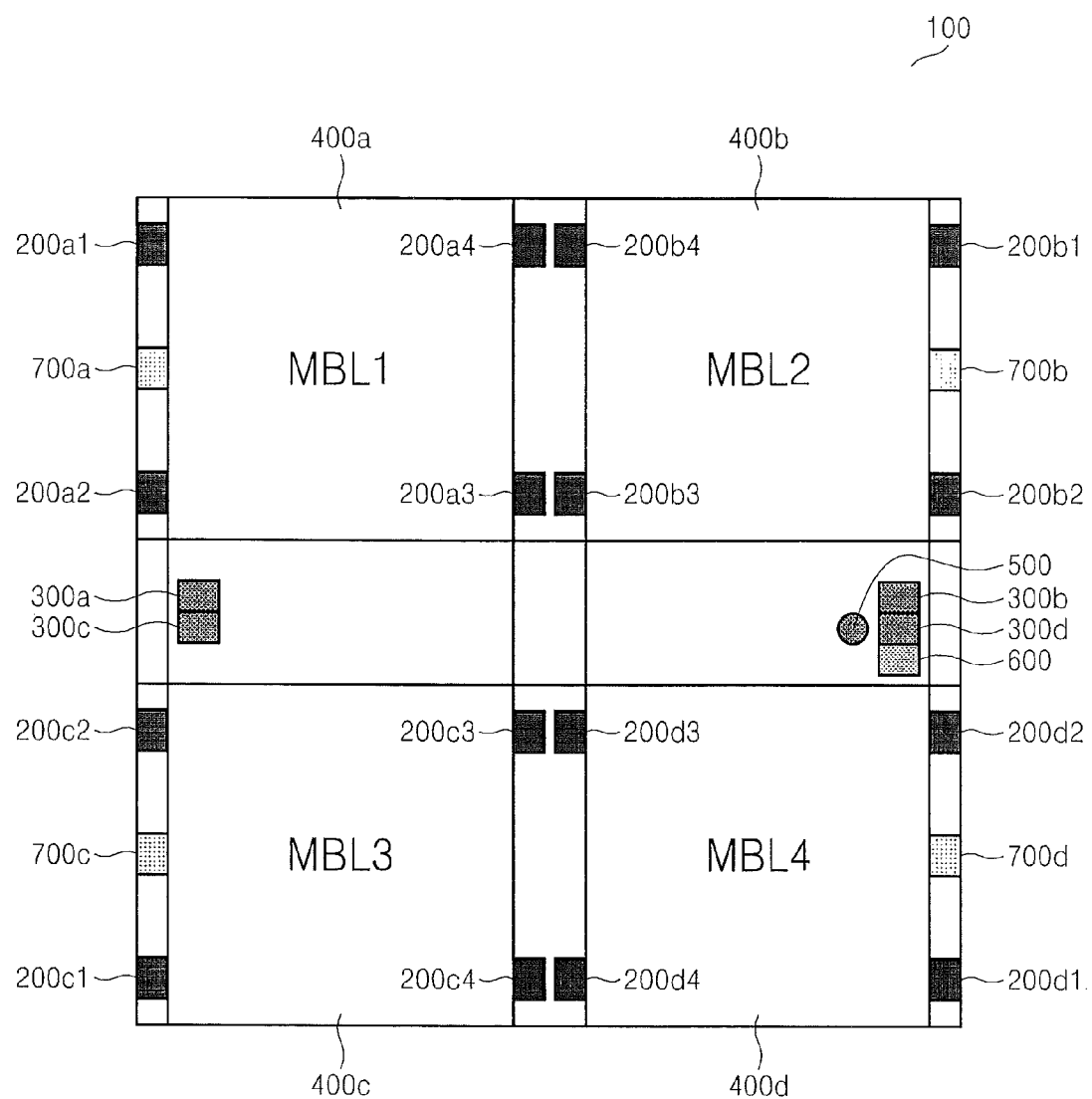
FIG. 1 schematically illustrates the structure of a multi-channel semiconductor integrated circuit device according some embodiments of the present inventive concept.

The inventive concept now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

Referring first to FIG. 1, a schematic illustration of the structure of multi-channel semiconductor integrated circuit device 100 according to some embodiments of the present inventive concept will be discussed. As illustrated in FIG. 1, the multi-channel semiconductor integrated circuit device 100 according to the some embodiments includes a plurality of, for example, four, memory devices MBL1, MBL2, MBL3, and MBL4, a detection unit 500, and a common control unit 600. The multi-channel semiconductor integrated circuit device 100 may be an integrated circuit device in which the memory devices MBL1, MBL2, MBL3, and MBL4 are integrated in a single chip. Each of the memory devices MBL1, MBL2, MBL3, and MBL4 separately includes a command and data input/output unit (not shown) so as to be independently accessible.

The memory devices MBL1, MBL2, MBL3, and MBL4, respectively, include a plurality of power generation units $200a1$, $200a2$, $200a3$, and $200a4$; $200b1$, $200b2$, $200b3$, and $200b4$; $200c1$, $200c2$, $200c3$, and $200c4$; and $200d1$, $200d2$, $200d3$, and $200d4$, control units $300a$, $300b$, $300c$, and $300d$, and bank blocks $400a$, $400b$, $400c$, and $400d$. Each of the bank blocks $400a$, $400b$, $400c$, and $400d$ may include a memory array (not shown) and a circuit to read/write data with respect to the memory array.

The power generation units $200a1$, $200a2$, $200a3$, and $200a4$; $200b1$, $200b2$, $200b3$, and $200b4$; $200c1$, $200c2$, $200c3$, and $200c4$; and $200d1$, $200d2$, $200d3$, and $200d4$ supply internal power, for example, direct current voltage and/or direct current, which is needed for the operation of the memory devices MBL1, MBL2, MBL3, and MBL4.

Furthermore, the control units $300a$, $300b$, $300c$, and $300d$ control the operation of the power generation units $200a1$, $200a2$, $200a3$, and $200a4$; $200b1$, $200b2$, $200b3$, and $200b4$; $200c1$, $200c2$, $200c3$, and $200c4$; and $200d1$, $200d2$, $200d3$, and $200d4$ according to the internal voltage of the memory devices MBL1, MBL2, MBL3, and MBL4.

The detection unit 500 detects the operation states of the four memory devices MBL1, MBL2, MBL3, and MBL4. For example, the detection unit 500 may detect whether each operation state of the four memory devices MBL1, MBL2, MBL3, and MBL4 is in an active operation state or a standby operation state.

The common control unit 600 determines a control mode according to the operation state of the four memory devices MBL1, MBL2, MBL3, and MBL4 detected by the detection unit 500. The control mode includes an individual control mode and a common control mode.

For example, when all of the four memory devices MBL1, MBL2, MBL3, and MBL4 are in the standby operation state, the common control mode may be determined by the common control unit 600. In these embodiments, the common control unit 600 may control the power generation units $200a1$, $200a2$, $200a3$, and $200a4$; $200b1$, $200b2$, $200b3$, and $200b4$; $200c1$, $200c2$, $200c3$, and $200c4$; and $200d1$, $200d2$, $200d3$, and $200d4$ for the four memory devices MBL1, MBL2, MBL3, and MBL4, and also control the number and/or operation order of the power generation units $200a1$, $200a2$, $200a3$, and $200a4$; $200b1$, $200b2$, $200b3$, and $200b4$; $200c1$, $200c2$, $200c3$, and $200c4$; and $200d1$, $200d2$, $200d3$, and $200d4$.

In particular, when the four memory devices MBL1, MBL2, MBL3, and MBL4 are all in the standby operation state, the common control unit 600 may operate only some of the power generation units $200a1$, $200a2$, $200a3$, and $200a4$; $200b1$, $200b2$, $200b3$, and $200b4$; $200c1$, $200c2$, $200c3$, and $200c4$; and $200d1$, $200d2$, $200d3$, and $200d4$ of the memory devices MBL1, MBL2, MBL3, and MBL4.

Furthermore, when the four memory devices MBL1, MBL2, MBL3, and MBL4 are all in the standby operation state, the common control unit 600 may operate only one, for example, the power generation units $200a1$, $200b1$, $200c1$, and $200d1$, of the power generation units $200a1$, $200a2$, $200a3$, and $200a4$; $200b1$, $200b2$, $200b3$, and $200b4$; $200c1$, $200c2$, $200c3$, and $200c4$; and $200d1$, $200d2$, $200d3$, and $200d4$ of the memory devices MBL1, MBL2, MBL3, and MBL4.

The common control unit 600 controls the power generation units $200a1$, $200b1$, $200c1$, and $200d1$, to be sequentially operated one by one, so that the multi-channel semiconductor integrated circuit device 100 may be operated.

For example, the power generation unit $200a1$ of MBL1 is first operated so that the multi-channel semiconductor integrated circuit device 100 may be operated. Next, the power generation unit $200b1$ of MBL2 is operated so that the multi-channel semiconductor integrated circuit device 100 may be operated. Next, the power generation unit $200c1$ of MBL3 is operated so that the multi-channel semiconductor integrated circuit device 100 may be operated. Next, the power generation unit $200d1$ of MBL4 is first operated so that the multi-channel semiconductor integrated circuit device 100 may be operated.

Furthermore, when the four memory devices MBL1, MBL2, MBL3, and MBL4 are all in the standby operation state, each of the memory devices MBL1, MBL2, MBL3, and MBL4 may further include standby power generation units 700a, 700b, 700c, and 700d for supplying power to the four memory devices MBL1, MBL2, MBL3, and MBL4.

When the four memory devices MBL1, MBL2, MBL3, and MBL4 are all in the active operation state, the power generation units 200a1, 200a2, 200a3, and 200a4; 200b1, 200b2, 200b3, and 200b4; 200c1, 200c2, 200c3, and 200c4; and 200d1, 200d2, 200d3, and 200d4 may be active power generation units that supply power to the memory devices MBL1, MBL2, MBL3, and MBL4.

In these embodiments, when the four memory devices MBL1, MBL2, MBL3, and MBL4 are all in the standby operation state, the standby power generation units 700a, 700b, 700c, and 700d respectively supply power to the memory devices MBL1, MBL2, MBL3, and MBL4.

When the four memory devices MBL1, MBL2, MBL3, and MBL4 are all in the standby operation state which is detected by the detection unit 500, the common control unit 600 may control the standby power generation units 700a, 700b, 700c, and 700d and adjust the number of the operating standby power generation units 700a, 700b, 700c, and 700d.

In particular, when the four memory devices MBL1, MBL2, MBL3, and MBL4 are all in the standby operation state, the common control unit 600 operates some of the standby power generation units 700a, 700b, 700c, and 700d of the memory devices MBL1, MBL2, MBL3, and MBL4, thereby operating the multi-channel semiconductor integrated circuit device 100.

Furthermore, when the four memory devices MBL1, MBL2, MBL3, and MBL4 are all in the standby operation state, the common control unit 600 operates only one of the standby power generation units 700a, 700b, 700c, and 700d of the memory devices MBL1, MBL2, MBL3, and MBL4, thereby operating the multi-channel semiconductor integrated circuit device 100.

The common control unit 600 controls the standby power generation units 700a, 700b, 700c, and 700d, to be sequentially operated one by one, so that the multi-channel semiconductor integrated circuit device 100 may be operated.

For example, the standby power generation unit 700a of MBL1 is first operated so that the multi-channel semiconductor integrated circuit device 100 may be operated. Next, the standby power generation unit 700b of MBL2 is operated so that the multi-channel semiconductor integrated circuit device 100 may be operated. Next, the standby power generation unit 700c of MBL3 is operated so that the multi-channel semiconductor integrated circuit device 100 may be operated. Next, the standby power generation unit 700d of MBL4 is first operated so that the multi-channel semiconductor integrated circuit device 100 may be operated.

Figure 2A:
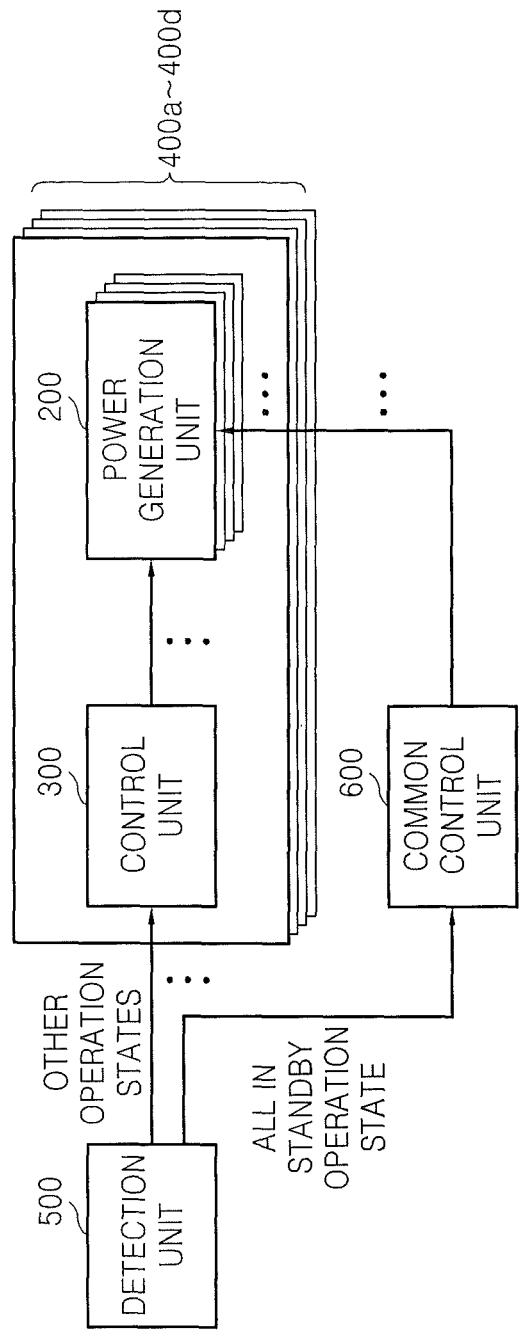
FIG. 2A is a block diagram illustrating an operational structure according to some embodiments of the present inventive concept.

Referring now to FIG. 2A, a block diagram illustrating details of multi-channel semiconductor integrated circuit device 100 according to some embodiments of the present inventive concept will be discussed. As illustrated in FIG. 2A, the detection unit 500 detects the operation state of the multi-channel semiconductor integrated circuit device 100.

When any one of the four memory devices MBL1, MBL2, MBL3, and MBL4 is determined to be in the active operation state, each of the four control units 300 controls the power generation unit 200 for each of the memory devices MBL1, MBL2, MBL3, and MBL4. When all of the four memory devices MBL1, MBL2, MBL3, and MBL4 are determined to be in the standby operation state, the common control unit 600 commonly controls the power generation unit 200 of each of the four memory devices MBL1, MBL2, MBL3, and MBL4.

Figure 2B:
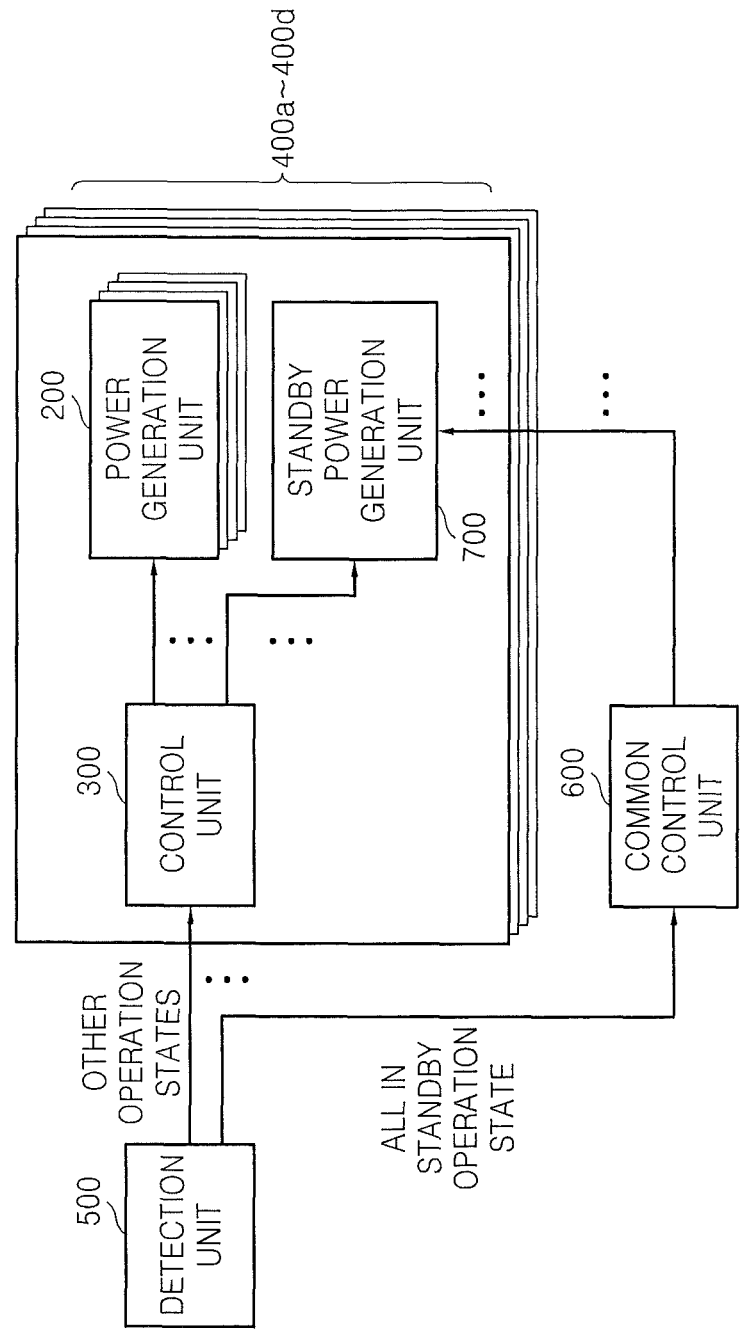
FIG. 2B is a block diagram illustrating an operational structure according to some embodiments of the present inventive concept.

Referring now to FIG. 2B, a block diagram illustrating details of multi-channel semiconductor integrated circuit device 100 according to some embodiments of the present inventive concept. A illustrated in FIG. 2B, the memory devices MBL1, MBL2, MBL3, and MBL4 further include a standby power generation unit 700 that supplies power to the memory devices MBL1, MBL2, MBL3, and MBL4 when the memory devices MBL1, MBL2, MBL3, and MBL4 are in the standby operation state.

As illustrated in FIG. 2B, the detection unit 500 detects the operation state of the multi-channel semiconductor integrated circuit device 100. When any one of the four memory devices MBL1, MBL2, MBL3, and MBL4 is determined to be in the active operation state, each control unit 300 of the four memory devices MBL1, MBL2, MBL3, and MBL4 controls the power generation unit 200 and the standby power generation unit 700 of each of the memory devices MBL1, MBL2, MBL3, and MBL4. When all of the four memory devices MBL1, MBL2, MBL3, and MBL4 are determined to be in the standby operation state, the common control unit 600 commonly controls the four standby power generation units 700 of the four memory devices MBL1, MBL2, MBL3, and MBL4.

Figure 3A:
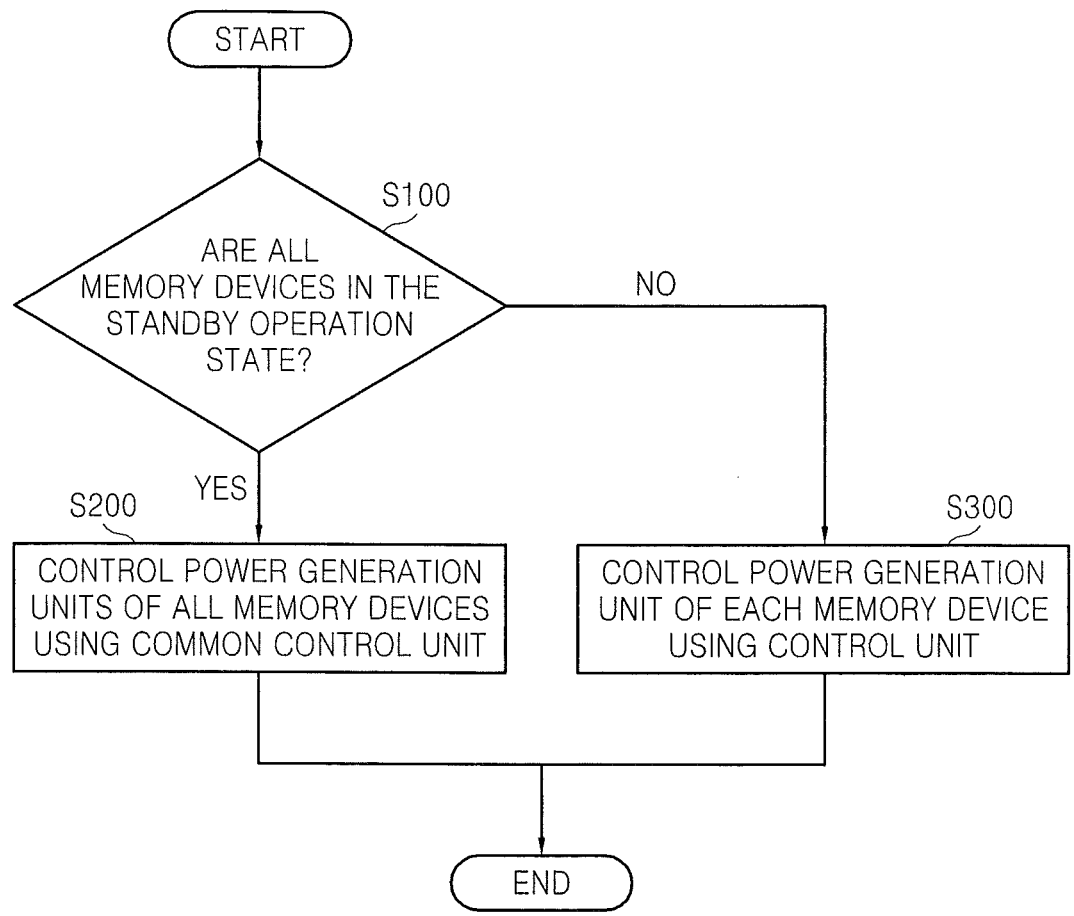
FIG. 3A is a flowchart illustrating operations according to some embodiments illustrated in FIG. 2A.

Referring now to FIG. 3A, a flowchart illustrating operations according to some embodiments illustrated in FIG. 2A will be discussed. As illustrated in FIG. 3A, the detection unit 500 determines whether the four memory devices MBL1, MBL2, MBL3, and MBL4 are all in the standby operation state. When the four memory devices MBL1, MBL2, MBL3, and MBL4 are all determined to be in the standby operation state, the common control unit 600 controls all power generation units 200 of the four memory devices MBL1, MBL2, MBL3, and MBL4 (S200). When any one of the four memory devices MBL1, MBL2, MBL3, and MBL4 is determined to be in the active operation state, the control unit 300 controls all power generation units 200 of the four memory devices MBL1, MBL2, MBL3, and MBL4 (S300).

Figure 3B:
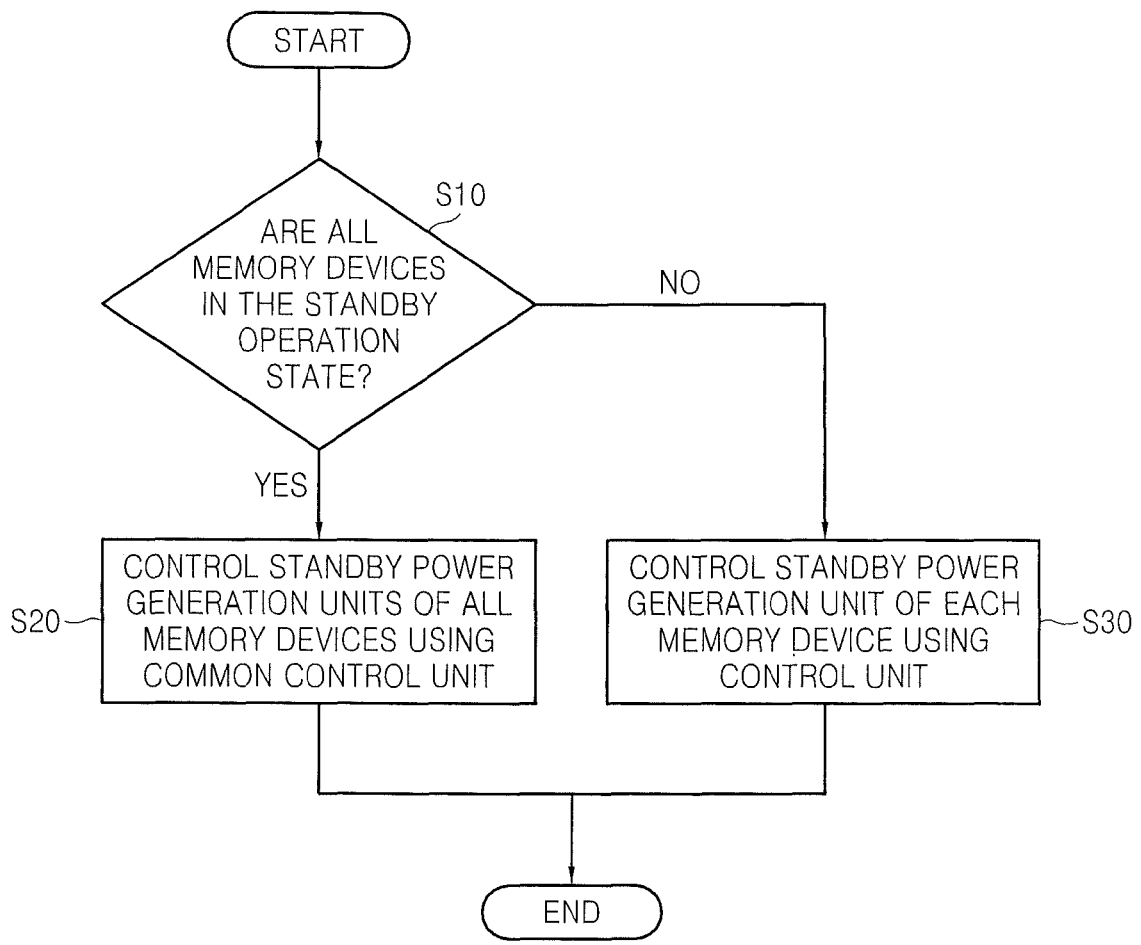
FIG. 3B is a flowchart illustrating operations according to some embodiments illustrated in FIG. 2B.

Referring now to FIG. 3B, a flowchart illustrating operations according to some embodiments illustrated in FIG. 2B will be discussed. As illustrated in FIG. 3B, the detection unit 500 determines whether the four memory devices MBL1, MBL2, MBL3, and MBL4 are all in the standby operation state. When the four memory devices MBL1, MBL2, MBL3, and MBL4 are all determined to be in the standby operation state, the common control unit 600 controls the four standby power generation units 700 (S20).

When any one of the four memory devices MBL1, MBL2, MBL3, and MBL4 is determined to be in the active operation state, the control unit 300 controls the power generation unit 200 and the standby power generation unit 700 of each of the four memory devices MBL1, MBL2, MBL3, and MBL4 (S30).

Figure 4A:
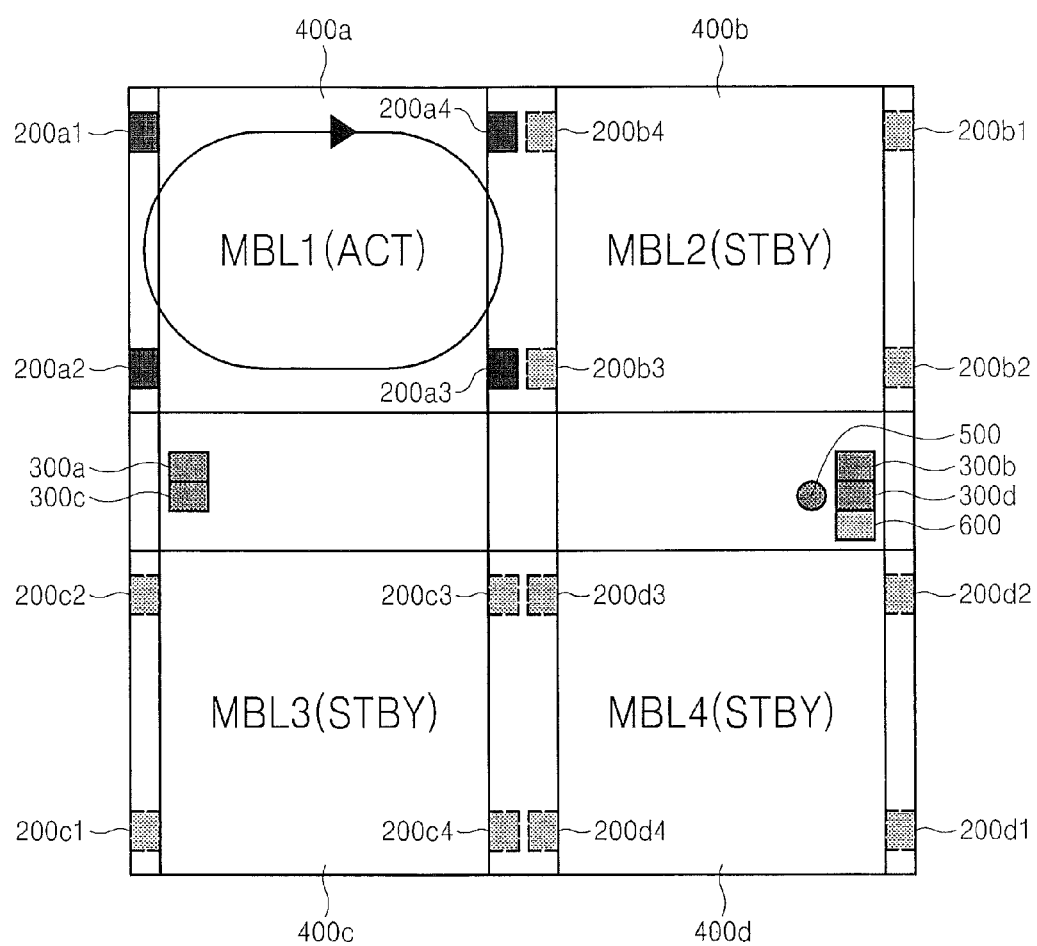
FIGS. 4A through 4D illustrate operation states of multi-channel semiconductor integrated circuit devices according to some embodiments illustrated in FIG. 2A.
Figure 4B:
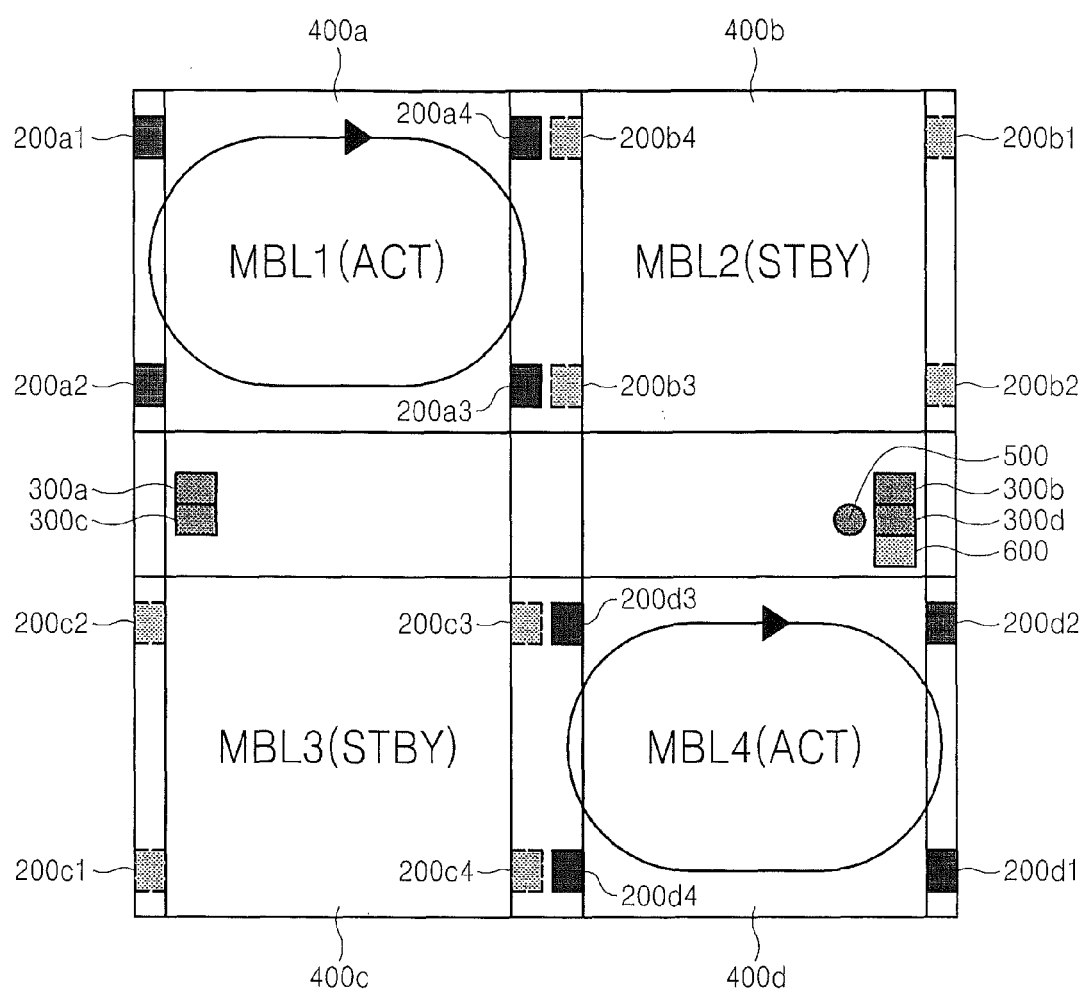

Referring now to FIG. 4A through 4D, operation states of the multi-channel semiconductor integrated circuit device 100 according to FIG. 2A will be discussed. As illustrated in FIG. 4A, the operation state of the multi-channel semiconductor integrated circuit device 100 in which MBL1 is in the active operation state and MBL2-MBL4 are in the standby operation state. As illustrated in FIG. 4B, the operation state of the multi-channel semiconductor integrated circuit device 100 in which MBL1 and MBL4 are in the active operation state and MBL2 and MBL3 are in the standby operation state.

Figure 4C:
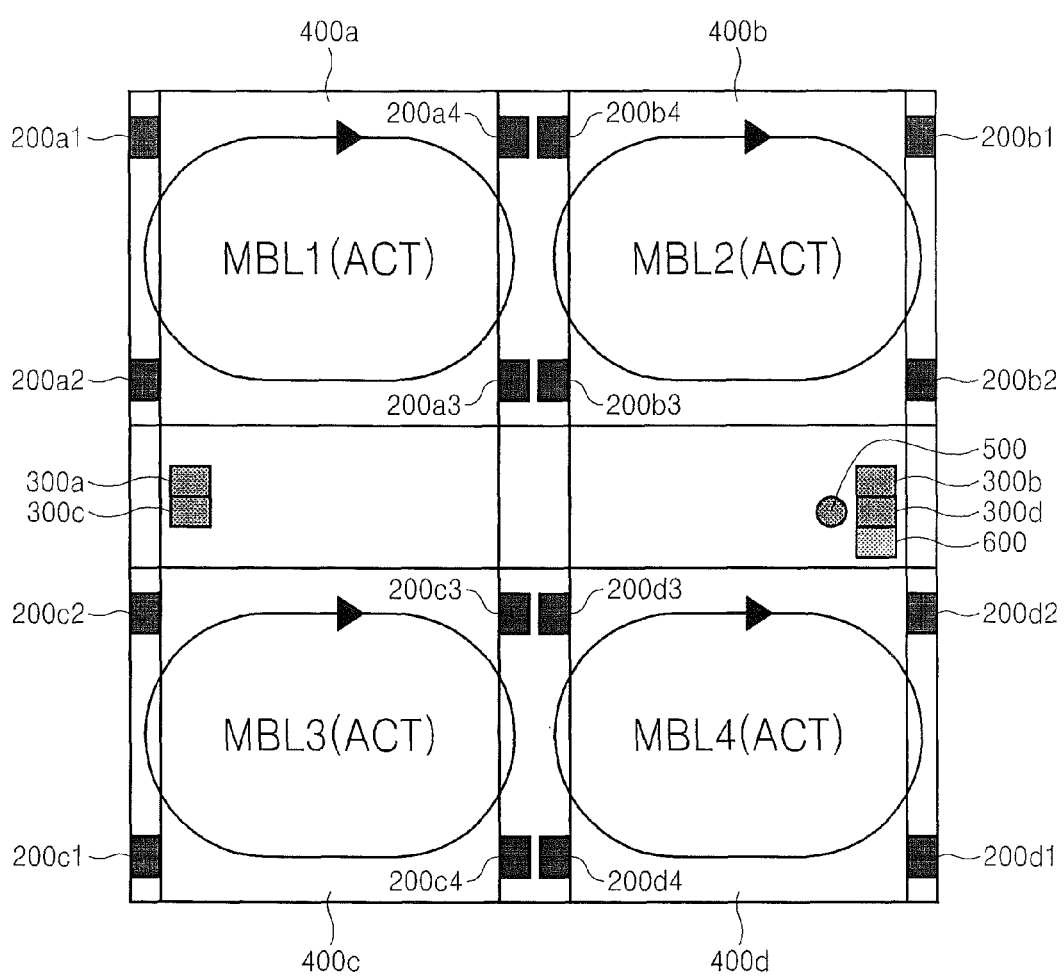

As illustrated in FIG. 4C, the multi-channel semiconductor integrated circuit device 100 is shown in which MBL1-MBL4 are all in the active operation state. As further illustrated in FIG. 4D, the multi-channel semiconductor integrated circuit device 100 is shown in which MBL1-MBL4 are all in the standby operation state.

In FIGS. 4A-4C, the control units 300a, 300b, 300c, and 300d of the four memory devices MBL1, MBL2, MBL3, and MBL4 control the power generation units 200a1, 200a2, 200a3, and 200a4; 200b1, 200b2, 200b3, and 200b4; 200c1, 200c2, 200c3, and 200c4; and 200d1, 200d2, 200d3, and 200d4 of the memory devices MBL1, MBL2, MBL3, and MBL4.

Figure 4D:
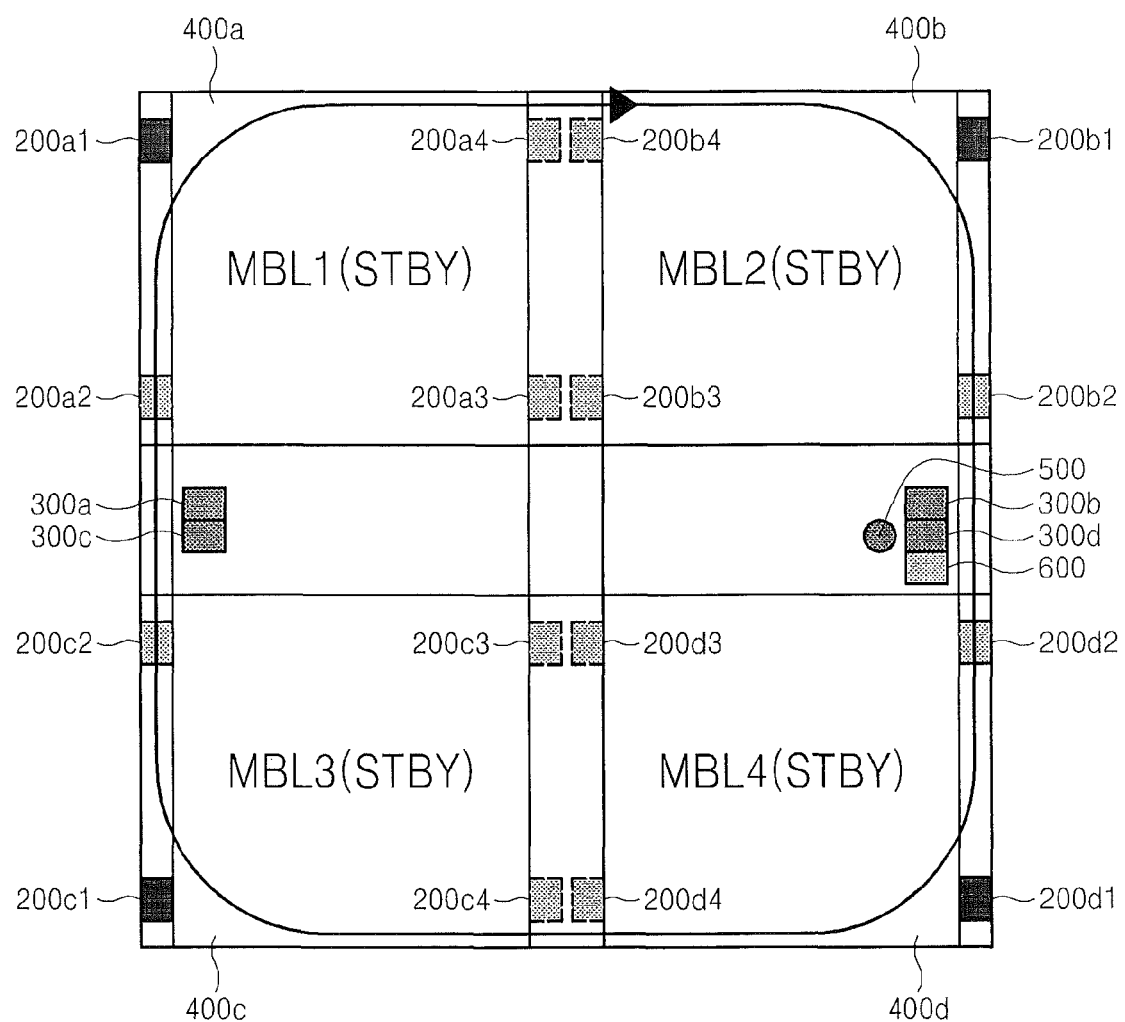

In FIG. 4D, the common control unit 600 controls the power generation units 200a1, 200a2, 200a3, and 200a4; 200b1, 200b2, 200b3, and 200b4; 200c1, 200c2, 200c3, and 200c4; and 200d1, 200d2, 200d3, and 200d4 of the memory devices MBL1, MBL2, MBL3, and MBL4. In FIG. 4D, the power generation units 200a1, 200b1, 200c1, and 200d1 of the memory devices MBL1, MBL2, MBL3, and MBL4 are sequentially operated, for example, in order of the power generation units 200a1, 200b1, 200c1, and 200d1, so that the multi-channel semiconductor integrated circuit device 100 may be operated.

Figure 5A:
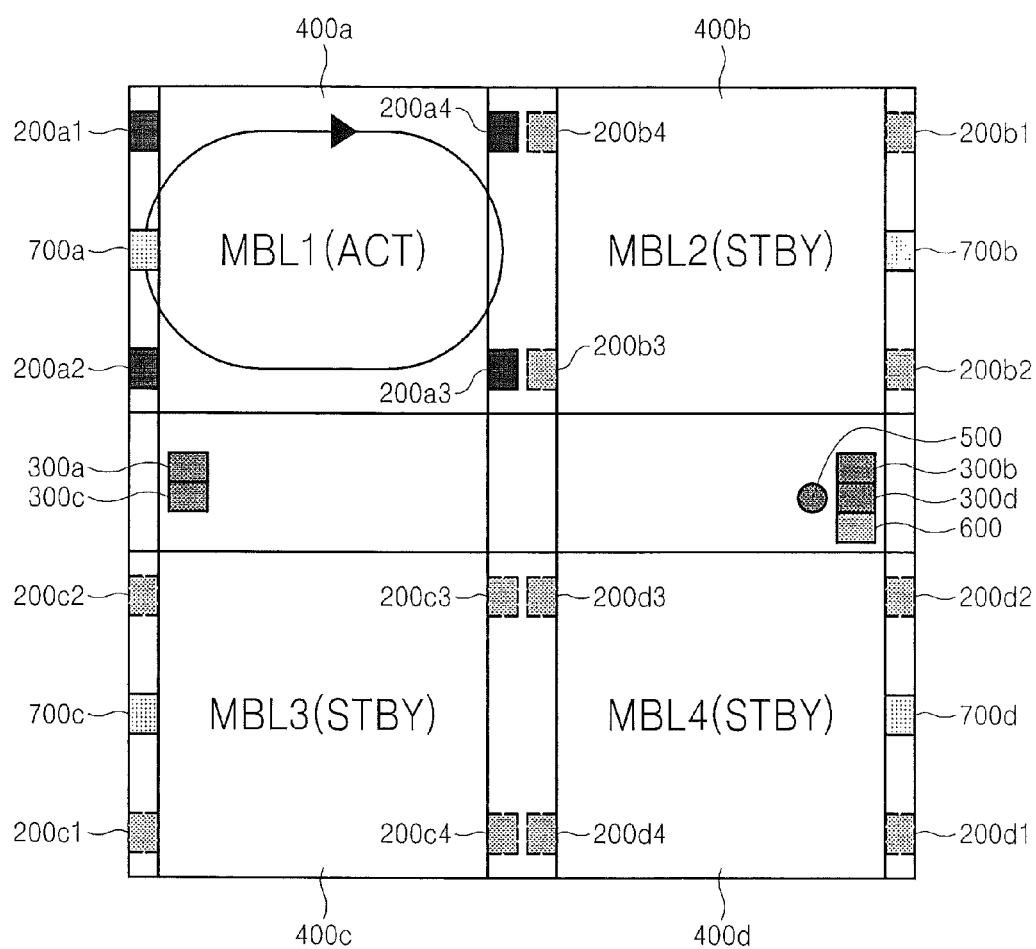
FIGS. 5A through 5D illustrate operation states of multi-channel semiconductor integrated circuit devices according to some embodiments illustrated in FIG. 2B.
Figure 5B:
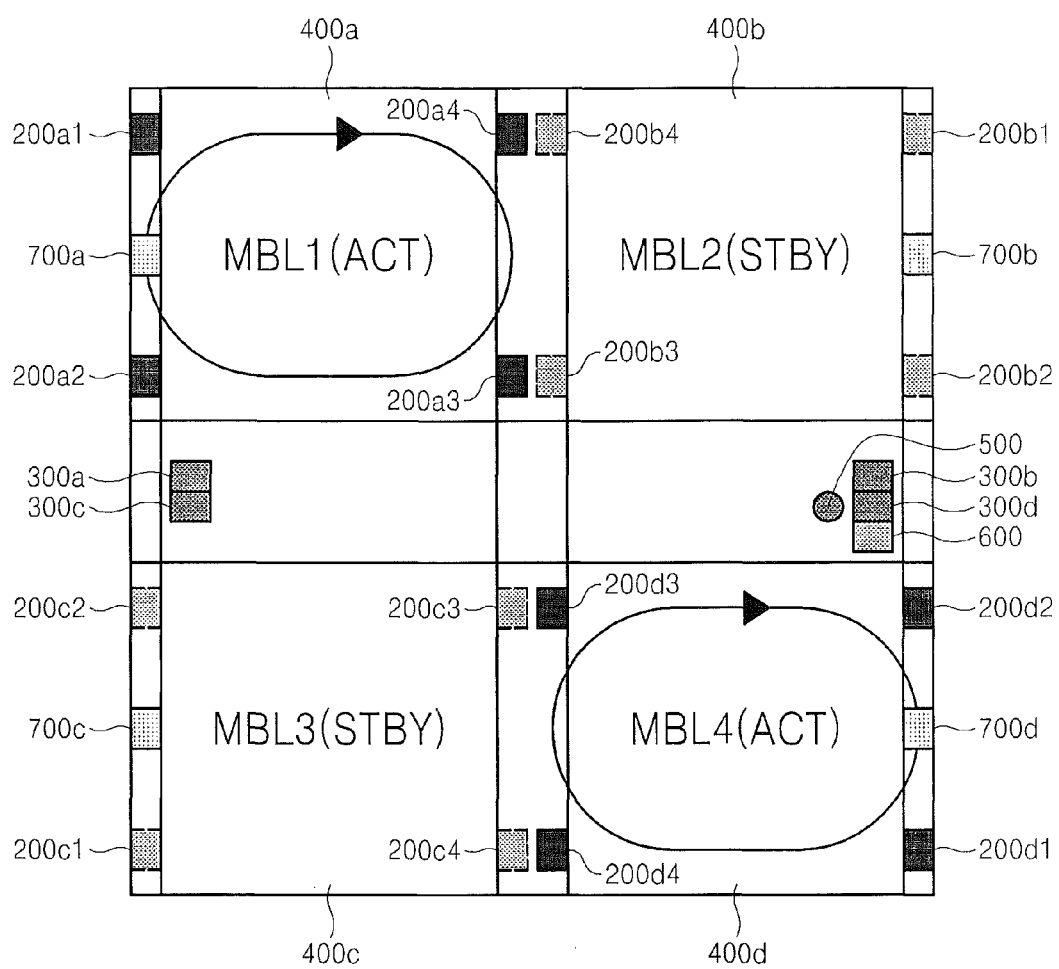

Referring now to FIGS. 5A-5D, the operation states of the multi-channel semiconductor integrated circuit device 100 according to FIG. 2B will be discussed. As illustrated in FIG. 5A, the multi-channel semiconductor integrated circuit device 100 is shown in which MBL1 is in the active operation state and MBL2-MBL4 are in the standby operation state. As illustrated in FIG. 5B, the multi-channel semiconductor integrated circuit device 100 is shown in which MBL1 and MBL4 are in the active operation state and MBL2 and MBL3 are in the standby operation state.

Figure 5C:
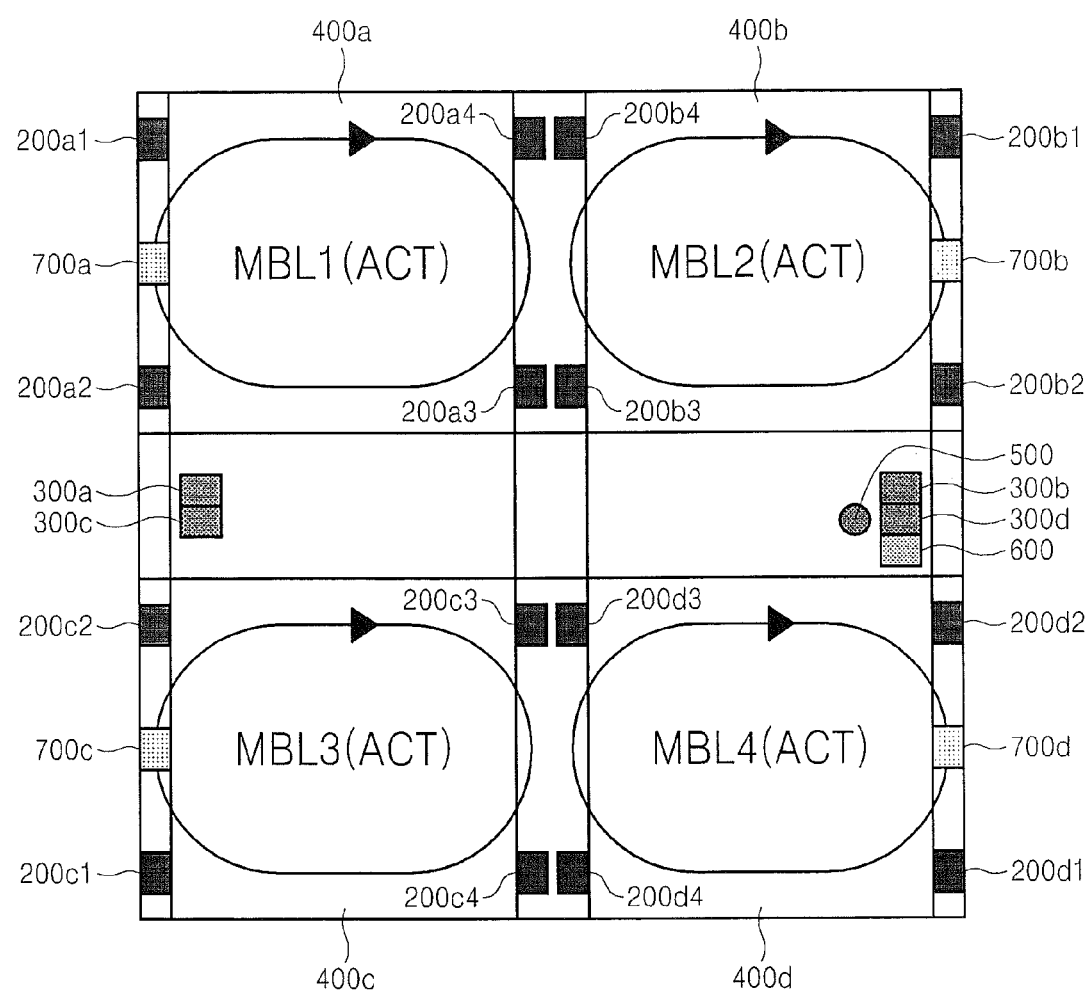
Figure 5D:
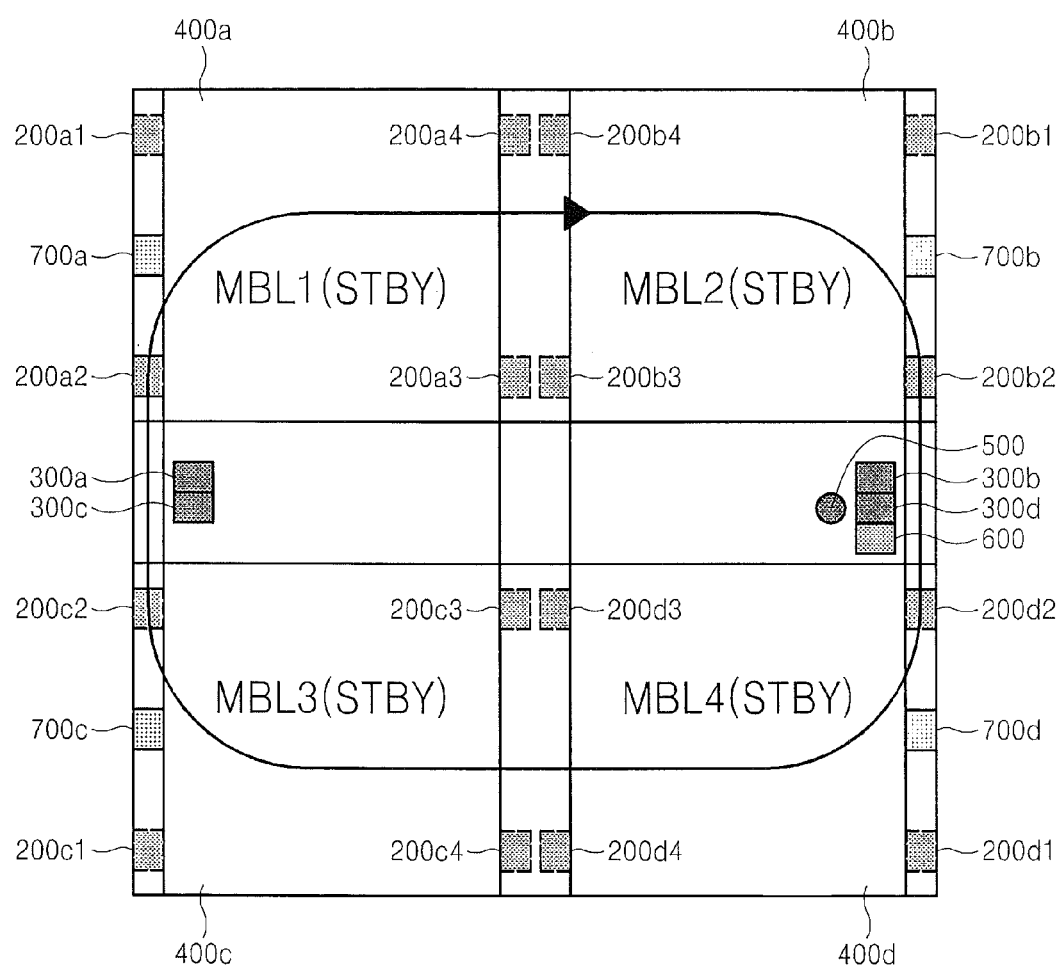

In FIG. 5C, the operation state of the multi-channel semiconductor integrated circuit device 100 in which MBL1-MBL4 are all in the active operation state. In FIG. 5D, the operation state of the multi-channel semiconductor integrated circuit device 100 in which MBL1-MBL4 are all in the standby operation state.

In FIGS. 5A-5C, the control units 300a, 300b, 300c, and 300d of the four memory devices MBL1, MBL2, MBL3, and MBL4 control the power generation units 200a1, 200a2, 200a3, and 200a4; 200b1, 200b2, 200b3, and 200b4; 200c1, 200c2, 200c3, and 200c4; and 200d1, 200d2, 200d3, and 200d4 and the standby power generation units 700a, 700b, 700c, and 700d of the memory devices MBL1, MBL2, MBL3, and MBL4.

In FIG. 5D, the common control unit 600 controls the standby power generation units 700a, 700b, 700c, and 700d of the memory devices MBL1, MBL2, MBL3, and MBL4. In FIG. 5D, the standby power generation units 700a, 700b, 700c, and 700d of the memory devices MBL1, MBL2, MBL3, and MBL5 are sequentially operated, for example, in order of the standby power generation units 700a, 700b, 700c, and 700d, so that the multi-channel semiconductor integrated circuit device 100 may be operated.

The power generation units 200a1, 200a2, 200a3, and 200a4; 200b1, 200b2, 200b3, and 200b4; 200c1, 200c2, 200c3, and 200c4; and 200d1, 200d2, 200d3, and 200d4 supply current for the internally required voltage according to the operation state of the multi-channel semiconductor integrated circuit device 100.

Figure 6A:
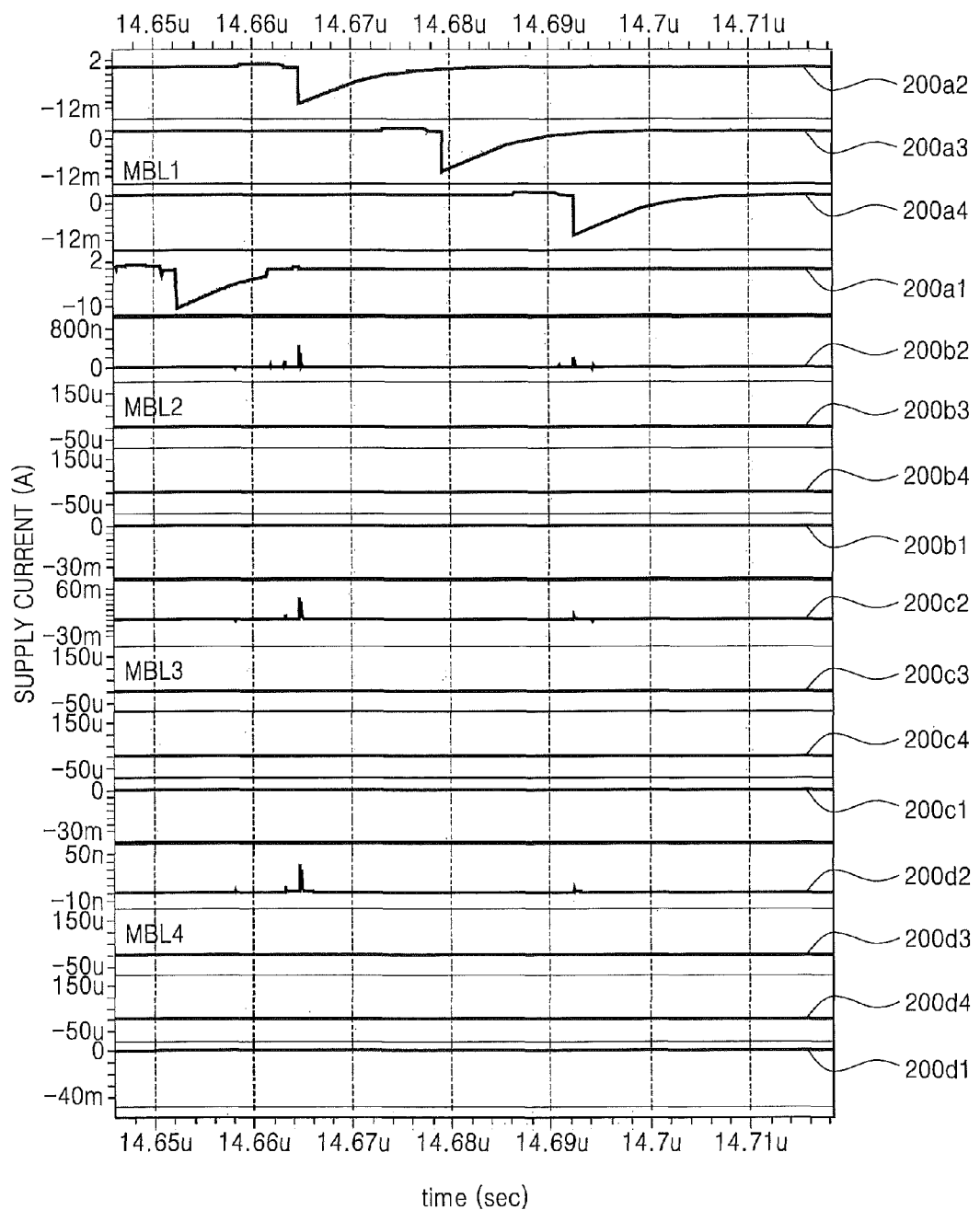
FIGS. 6A through 6C are graphs illustrating a supply current of the power generation unit for each of the operation states of the multi-channel semiconductor integrated circuit devices according to some embodiments in FIG. 2A.
Figure 6B:
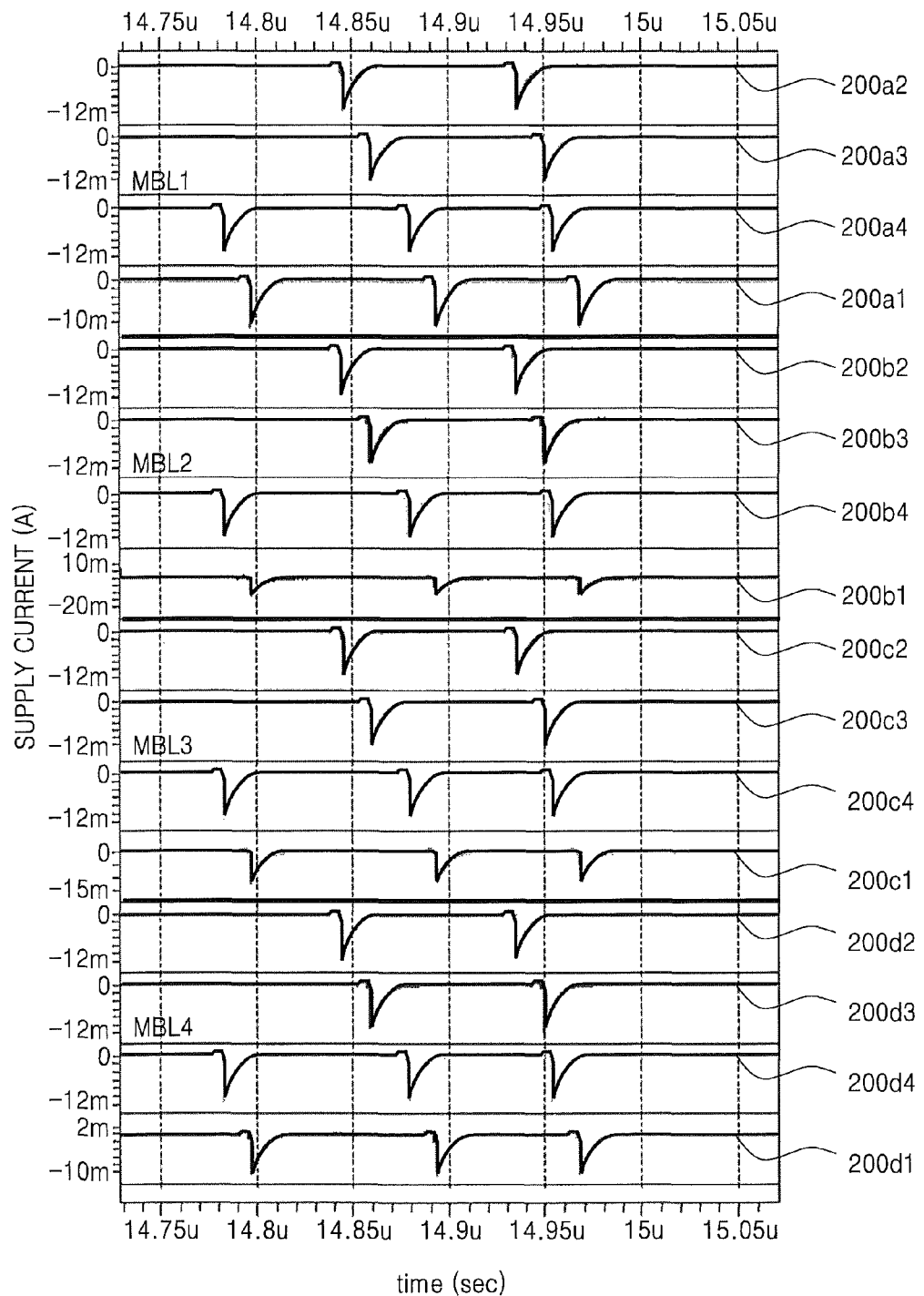
Figure 6C:
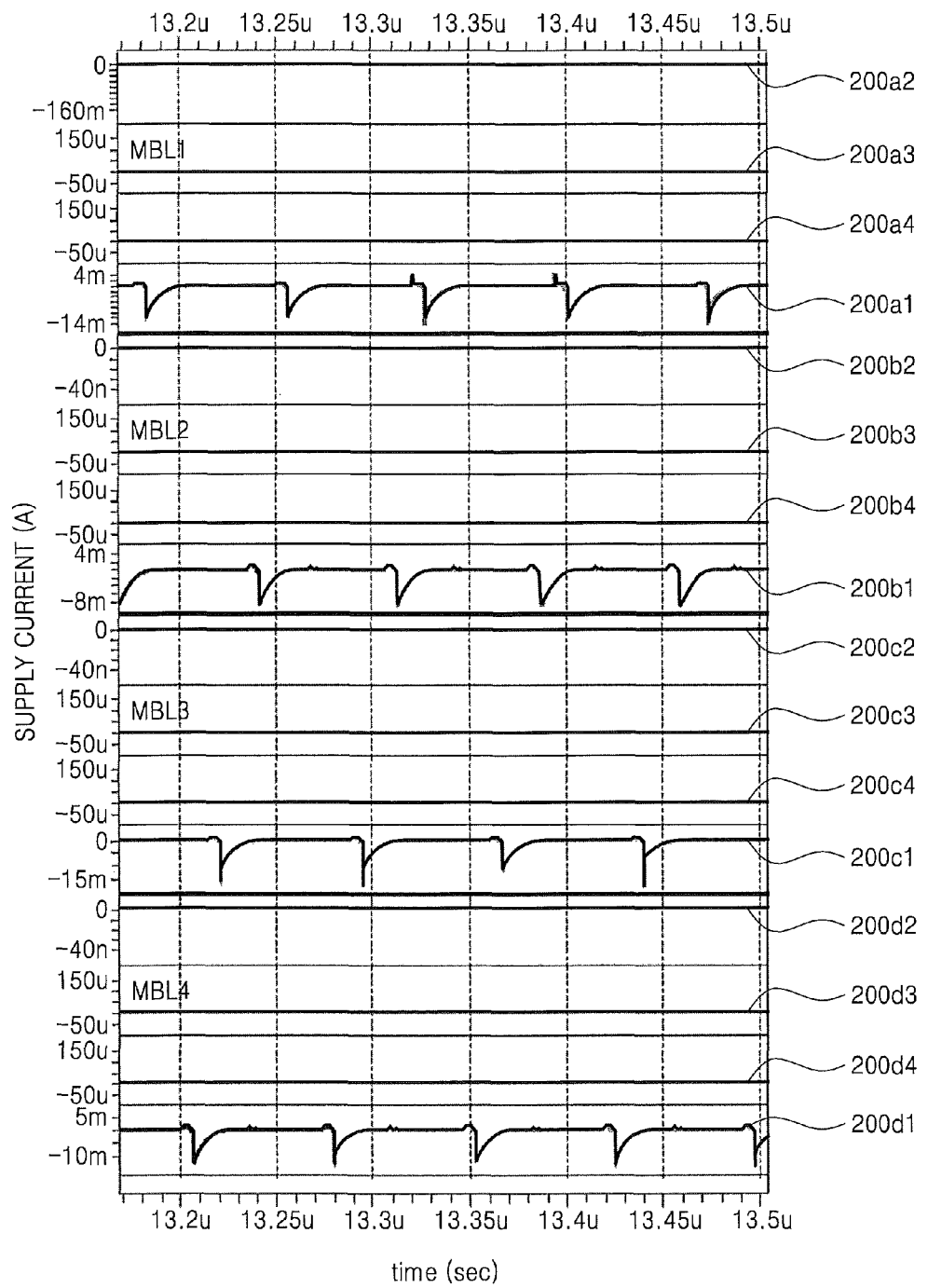

Referring now to FIGS. 6A-6C, graphs showing supply current of the power generation units 200a1, 200a2, 200a3, and 200a4; 200b1, 200b2, 200b3, and 200b4; 200c1, 200c2, 200c3, and 200c4; and 200d1, 200d2, 200d3, and 200d4 for each of the operation states of the multi-channel semiconductor integrated circuit device 100 according to FIG. 2A will be discussed. In FIGS. 6A-6C, the horizontal axis denotes time and the vertical axis denotes supply current.

In the current graphs of MBL1, MBL2, MBL3, and MBL4 of FIGS. 6A-6C, the fourth graph corresponds to a graph of the current supplied by the power generation unit 200a1 of FIG. 1. Also, the first to third graphs correspond to graphs of the current supplied by the power generation units 200b1, 200c1, and 200d1.

Referring to FIG. 6A, in the operation state of the multi-channel semiconductor integrated circuit device 100, MBL1 is in the active operation state and MBL2-MBL4 are in the standby operation state. In MBL1, the current needed in the active state is supplied by the power generation units 200a1, 200a2, 200a3, and 200a4 of MBL1. Since the power generation units 200a1, 200a2, 200a3, and 200a4 of MBL1 sequentially supply the current needed in the active operation state, as illustrated in FIG. 6A, the power generation units 200a1, 200a2, 200a3, and 200a4 supply a predetermined current to MBL1 with a time difference.

Referring to FIG. 6B, in the operation state of the multi-channel semiconductor integrated circuit device 100, MBL1-MBL4 are all in the active operation state. In MBL1-MBL4, the current needed in the active state is supplied by each of the power generation units 200a1, 200a2, 200a3, and 200a4; 200b1, 200b2, 200b3, and 200b4; 200c1, 200c2, 200c3, and 200c4; and 200d1, 200d2, 200d3, and 200d4 of the MBL1-MBL4. The power generation units 200a1, 200a2, 200a3, and 200a4; 200b1, 200b2, 200b3, and 200b4; 200c1, 200c2, 200c3, and 200c4; and 200d1, 200d2, 200d3, and 200d4 of MBL1-MBL4 sequentially supply the current needed in the active operation state. Thus, as illustrated in FIG. 6B, the power generation units 200a1, 200a2, 200a3, and 200a4; 200b1, 200b2, 200b3, and 200b4; 200c1, 200c2, 200c3, and 200c4; and 200d1, 200d2, 200d3, and 200d4 supply a predetermined current to MBL1-MBL4 with a time difference.

Referring to FIG. 6C, in the operation state of the multi-channel semiconductor integrated circuit device 100, MBL1-MBL4 are all in the standby operation state. In MBL1-MBL4, the current needed in the standby state is supplied by the power generation units 200a1, 200b1, 200c1, and 200d1 of MBL1-MBL4. Since the power generation units 200a1, 200b1, 200c1, and 200d1 of MBL1-MBL4 sequentially supply the current needed in the standby operation state, as illustrated in FIG. 6C, the power generation units 200a1, 200b1, 200c1, and 200d1 supply a predetermined current to MBL1-MBL4 with a time difference.

Figure 7:
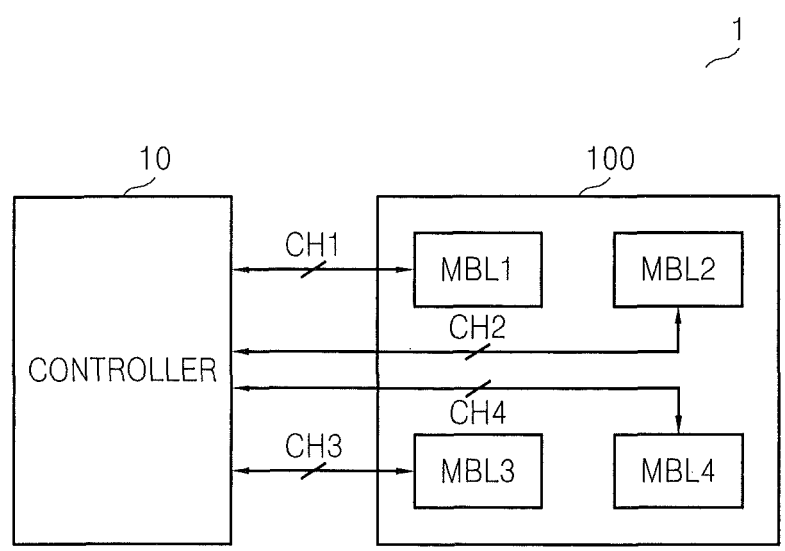
FIG. 7 is a block diagram schematically illustrating the structure of a system including multi-channel semiconductor integrated circuit devices according to some embodiments of the present inventive concept.

Referring now to FIG. 7, a block diagram schematically illustrating the structure of a system 1 including the multi-channel semiconductor integrated circuit device 100 according to some embodiments of the present inventive concept. As illustrated in FIG. 7, the system 1 according to the present exemplary embodiment includes the multi-channel semiconductor integrated circuit device 100 and a controller 10. The system 1 of FIG. 7 may be implemented as a memory card.

The controller 10 may be configured to communicate with an external device(for example, a host) via any one of USB (Universal Serial Bus), MMC(MultiMediaCard) interface, PCI-E(PCI-Express) interface, SATA(Serial AT Attachment), PATA(Parallel AT Attachment), SCSI(Small Computer System Interface), ESDI(Enhanced Small Disk Interface), and IDE(Integrated Drive Electronics) interface, etc. The multi-channel semiconductor integrated circuit device 100 may be used as a data memory device or a code memory device for mobile devices such as a cellular phone, a PDA(Personal digital assistant), a digital camera, a portable game console, and a MP3 player. The multi-channel semiconductor integrated circuit device 100 may be used as a data memory device or a code memory device for mobile devices such as a cellular phone, a PDA(Personal digital assistant), a digital camera, a portable game console, and a MP3 player. Furthermore, the multi-channel semiconductor integrated circuit device 100 may be used as a data memory device or a code memory device for home application system such as a computer, a HDTV(High-definition television), a DVD('Digital Versatile Disc' or 'Digital Video Disc'), a router, and a GPS (Global Positioning System)

The multi-channel semiconductor integrated circuit device 100 and/or the controller 10 according to some embodiments of the present inventive concept may be packed in various types of packages. For example, the various packages may include PoP(Package on Package), Ball grid arrays(BGAs), Chip scale packages(CSPs), Plastic Leaded Chip Carrier (PLCC), Plastic Dual In-Line Package(PDIP), Die in Waffle Pack, Die in Wafer Form, Chip On Board(COB), Ceramic Dual In-Line Package(CERDIP), Plastic Metric Quad Flat Pack(MQFP), Thin Quad Flatpack(TQFP), Small Outline (SOIC), Shrink Small Outline Package(SSOP), Thin Small Outline(TSOP), Thin Quad Flatpack(TQFP), System In Package(SIP), Multi Chip Package(MCP), Wafer-level Fabricated Package(WFP), Wafer-Level Processed Stack Package(WSP).

As described above, according to some embodiments of the present inventive concept, since the multi-channel semiconductor integrated circuit device including a plurality of channels that are independently operated is integrally controlled, deviation in the charge consumption amount according to the active timing of each channel may be reduced. Furthermore, during the standby operation, the standby voltage ripple and standby current may be reduced.

While the inventive concept has been particularly shown and described with reference to exemplary embodiments thereof, it will be understood that various changes in form and details may be made therein without departing from the spirit and scope of the following claims. For example, although, in the above-described embodiments and drawings, a particular number, for example, 4, is referred to as the number of the memory devices and the number of the power generation units included in each memory device for convenience of explanation, the number is a merely an example and may be changed without limit.

What is claimed is:

1. A multi-channel semiconductor integrated circuit device comprising:
   a plurality of memory devices that are independently accessible, each of the plurality of memory devices comprising at least one associated power generation unit and a dedicated control unit for controlling an operation of the at least one associated power generation unit;
   a detection unit configured to detect an operation state of the plurality of memory devices; and
   a common control unit separate and distinct from the dedicated control unit for each of the plurality of memory devices and configured to commonly control an operation of all of the at least one power generation unit of all of the plurality of memory devices at a same time according to the operation state of the plurality of memory devices detected by the detection unit,
   wherein the dedicated control units of each of the plurality of memory devices are configured to control the operation of the at least one power generation unit of a corresponding one of the plurality of memory devices and are separate from the common control unit configured to control all of the plurality of memory devices.

2. The multi-channel semiconductor integrated circuit device of claim 1, wherein the common control unit controls the number and operation order of operating ones of the power generation units when the plurality of memory devices are all in a standby operation state.

3. The multi-channel semiconductor integrated circuit device of claim 1, wherein the common control unit controls the at least one power generation unit included in each of the plurality of memory devices so that some of the at least one power generation unit are operated for each memory device.

4. The multi-channel semiconductor integrated circuit device of claim 3, wherein the common control unit controls the at least one power generation unit to be sequentially operated one by one.

5. The multi-channel semiconductor integrated circuit device of claim 1, wherein the at least one power generation unit comprises:
   an active power generation unit configured to supply power to a corresponding one of the plurality of memory devices when the corresponding memory device is in the active operation state; and
   a standby power generation unit configured to supply power to a corresponding one of the plurality of memory devices when the corresponding memory device is in the standby operation state.

6. The multi-channel semiconductor integrated circuit device of claim 5, wherein the common control unit controls an operation of the standby power generation unit of each of the plurality of memory devices when the plurality of memory devices detected by the detection unit are all in the standby operation state.

7. The multi-channel semiconductor integrated circuit device of claim 5, wherein the common control unit controls the standby power generation unit to be sequentially operated one by one for each of the plurality of memory devices.

8. A memory system comprising the multi-channel semiconductor integrated circuit device of claim 1 and a controller configured to control the multi-channel semiconductor integrated circuit device.

9. A multi-channel semiconductor integrated circuit device comprising:
   a plurality of memory devices that are independently accessible, each of the plurality of memory devices comprising at least one power generation unit; and
   a detection unit for detecting an operation state of the plurality of memory devices,
   wherein the at least one power generation unit of the plurality of memory devices configured to be independently controlled for each of the plurality of memory devices by a dedicated control unit or commonly controlled for the plurality of memory devices by a common control unit, separate and distinction from the dedicated control unit, according to a control mode determined by the operation state of the plurality of memory devices detected by the detection unit.

10. The multi-channel semiconductor integrated circuit device of claim 9:
    wherein the control mode comprises an individual control mode and a common control mode;
    wherein each of the plurality of memory devices further comprises a control unit for controlling an operation of the at least one power generation unit of a corresponding memory device in the individual control mode; and
    wherein the multi-channel semiconductor integrated circuit device further comprises a common control unit for commonly controlling the operation of the at least one power generation unit of the plurality of memory devices in the common control mode.

11. The multi-channel semiconductor integrated circuit device of claim 10 wherein the plurality of memory devices are all in the standby operation state in the common control mode, and at least one of the plurality of memory devices is in the active operation state in the individual control mode.

12. The multi-channel semiconductor integrated circuit device of claim 10:

wherein, in the common control mode, the common control unit operates some of the at least one power generation unit included in each of the plurality of memory devices to be sequentially operated so as to supply power to the plurality of memory devices; and wherein, in the individual control mode, the control unit in a bank block in the active operation state of the plurality of memory devices operates the at least one power generation unit of a corresponding memory device to be sequentially operated so as to supply power to the corresponding memory device.

13. A memory system comprising the multi-channel semiconductor integrated circuit device of claim 9 and a controller configured to control the multi-channel semiconductor integrated circuit device.

14. A memory system comprising:

a multi-channel semiconductor integrated circuit device comprising a plurality of memory devices, each comprising at least one power generation unit, and a detection unit for detecting an operation state of the plurality of memory devices;

a controller configured to control the multi-channel semiconductor integrated circuit device; and a plurality of channels, each independently interfacing a corresponding one of the plurality of memory devices and the controller, wherein the at least one power generation unit of the plurality of memory devices is commonly controlled in a common control mode by a common control unit and individually controlled for each of the plurality of memory devices by a dedicated control unit, separate and distinct from the common control unit, according to an operation state of the corresponding memory device in an individual control mode, and the individual control mode and the common control mode are determined according to the operation state of the plurality of memory devices detected by the detection unit.

15. The memory system of claim 14:

wherein the control mode comprises the individual control mode and the common control mode;

wherein each of the plurality of memory devices further comprises a control unit for controlling an operation of the at least one power generation unit of the corresponding memory device in the individual control mode; and wherein the multi-channel semiconductor integrated circuit device further comprises a common control unit for commonly controlling the operation of the at least one power generation unit of the plurality of memory devices in the common control mode.

16. The memory system of claim 14:

wherein the plurality of memory devices are all in a standby operation state in the common control mode; and wherein at least one of the plurality of memory devices is in an active operation state in the in the individual control mode.

* * * * *